United States Patent
Park

[19]

[11] Patent Number: 6,137,178
[45] Date of Patent: Oct. 24, 2000

[54] SEMICONDUCTOR METALIZATION SYSTEM AND METHOD

[75] Inventor: Young-Jin Park, Poughkeepsie, N.Y.

[73] Assignee: Siemens Aktiengesellschaft, Munich, Germany

[21] Appl. No.: 09/099,093

[22] Filed: Jun. 17, 1998

[51] Int. Cl.[7] .......................... H01L 23/48; H01L 23/52; H01L 29/40
[52] U.S. Cl. .......................... 257/758; 257/773; 257/774
[58] Field of Search .................................. 257/758, 774, 257/773

[56] References Cited

U.S. PATENT DOCUMENTS

| | | | |
|---|---|---|---|
| 5,471,093 | 11/1995 | Cheung | 257/758 |
| 5,691,574 | 11/1997 | Suzuki . | |
| 5,702,982 | 12/1997 | Lee et al. | 437/195 |
| 5,739,587 | 4/1998 | Sato . | |
| 5,753,976 | 5/1998 | Harvey . | |

OTHER PUBLICATIONS

PCT Publication No. WO 97/47036, International Appln. No. PCT/US97/02513 filed Feb. 18, 1997.
Publication entitled "Dual Damascene: A ULSI Wiring Technology" by Kaanta et al., pp. 144–152.

*Primary Examiner*—Sheila V. Clark
*Attorney, Agent, or Firm*—Stanton C. Braden

[57] ABSTRACT

A method for forming a metalization system is provided. The method includes providing a substrate. A dielectric layer is formed over a surface of the substrate. A plurality of via holes is formed into a surface and the dielectric layer, such holes passing through the dielectric layer. Recesses are formed in the surface of the dielectric layer, such recesses terminating in a portion of the plurality of via holes passing through the dielectric layer. A metalization layer is deposited over the surface of the dielectric layer, portions of the metalization layer passing through the via holes, portions of the metalization layer being disposed in the recesses and portions of the metalization layer being disposed on the surface of the dielectric layer. The metalization layer is patterned into a plurality of conductors, one portion of the conductors being disposed on one level of the dielectric layer and another portion of the conductors disposed in the recesses. A metalization system having a substrate with a dielectric layer disposed over such substrate. A plurality of electrical conductors is provided, one portion of the conductors being disposed on one level of the dielectric layer and another portion of the conductors being recessed in a surface portion of the dielectric layer.

14 Claims, 4 Drawing Sheets

FIG. 1A
(PRIOR ART)
FIG. 1B
(PRIOR ART)
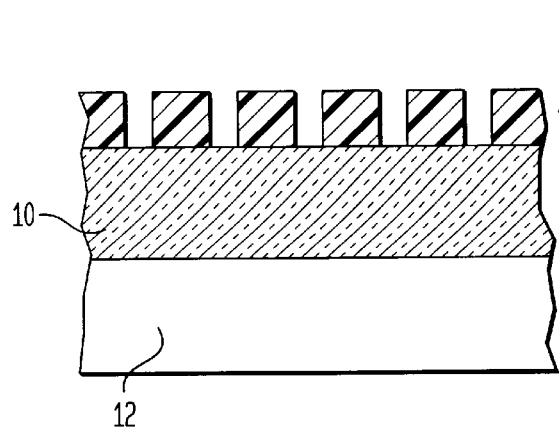
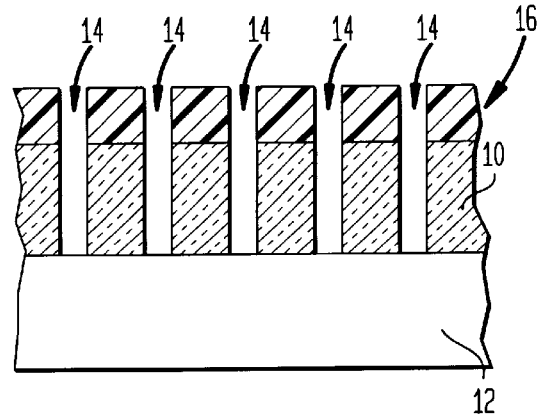
FIG. 1C
(PRIOR ART)
FIG. 1D
(PRIOR ART)
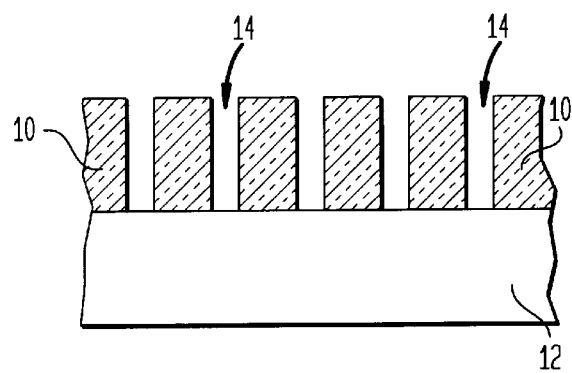
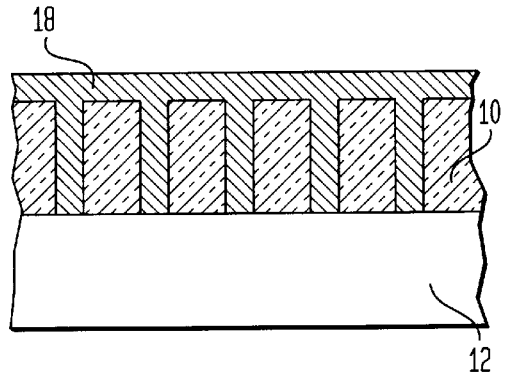
FIG. 1E
(PRIOR ART)
FIG. 1F
(PRIOR ART)
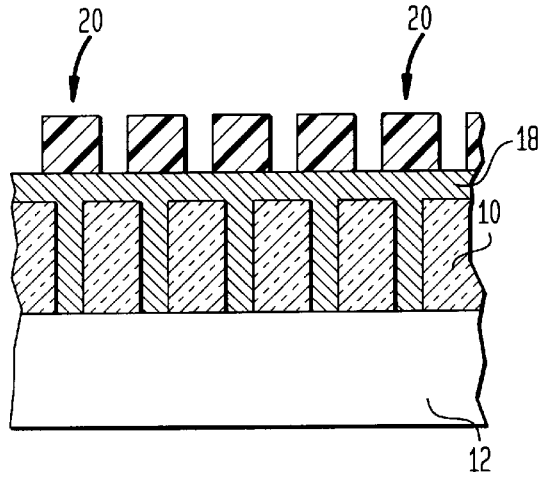
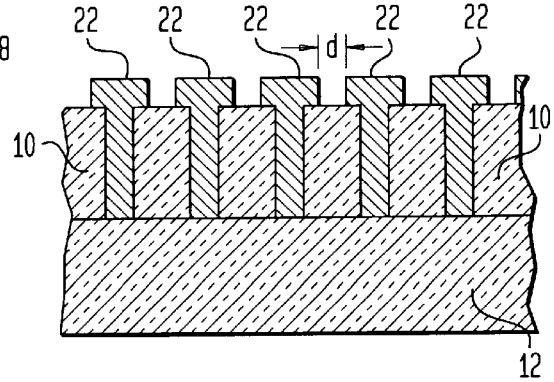

SEMICONDUCTOR METALIZATION SYSTEM AND METHOD

BACKGROUND OF THE INVENTION

This invention relates generally to semiconductor metalization system and methods and more particularly to metalization systems having reduced inter-conductor capacitance.

As is known in the art, current method to form electrical conductors (i.e., conducting wires) are categorized into the following methods: A reactive ion etching (RIE) method; and a dual Damascene method. With the RIE method, a dielectric layer 10 is formed over a semiconductor substrate 12, as shown in FIG. 1A. Via holes 14 are etched through selected regions of the dielectric layer 10 using a patterned photoresist mask 16, as shown in FIG. 1B. The mask 16 is removed as shown in FIG. 1C. A metalization layer 18 is deposited over the surface of the etched dielectric layer 12 and through the etched via holes 14, as shown in FIG. 1D. A second photoresist layer 20 is then patterned as shown in FIG. to expose portions of the metalization layer 18 which are to separate the conductors to be patterned into the metalization layer 18. A RIE process is then used to remove the exposed portions of the metalization layer 18 to thereby form the dielectrically isolated conductors 22, as shown in FIG. 1F.

With the dual Damascene method, again a dielectric layer 10 is formed over a semiconductor substrate 12, as shown in FIG. 2A. Via holes 14 are etched through selected portions of the dielectric layer 10 using a patterned photoresist mask 16, as shown in FIG. 2B. The mask 16 is removed, as shown in FIG. 2C. A second photoresist layer 16' is formed over the dielectric layer 10 and is patterned to expose surface portions of the dielectric layer 10 disposed around the periphery 15 of the via holes 14, as shown in FIG. 2D. The exposed surface portions of the dielectric layer 10 are etched to form recesses 141 in the dielectric layer 10 around the upper portions of the via holes 14, as shown in FIG. 2E. A metalization layer 18 is deposited over the surface of the etched dielectric layer 10, portions of the metalization layer passing through the via holes 14, other portions of the metalization layer being disposed in the recesses 14' and still other portions of the metalization layer 18 being disposed on the surface of the dielectric layer 10, as shown in FIG. 2F. The portions of the metalization layer 18 disposed on the upper surface of the dielectric layer 10 are removed by, for example, chemical mechanical polishing (CMP) to thereby form the dielectrically isolated conductors, as shown in FIG. 2G. It is noted that the upper surface portions of the conductors 22' are exposed for connection to other devices or other metalization layers, not shown, which may be formed over the metalization layer 18.

With both of these methods, the capacitance between adjacent conductors 22, 22' is inversely proportional to the distance, d, between such adjacent conductors. Thus, an increase in device density will correspondingly reduce the distance d and increase the capacitance between adjacent conductors. This increase in capacitance results in delay to signals passing through the conductors 22, 22'.

SUMMARY OF THE INVENTION

In accordance with the invention, a method for forming a metalization system is provided. The method includes providing a substrate. A dielectric layer is formed over a surface of the substrate. A plurality of via holes is formed into a surface and the dielectric layer, such holes passing through the dielectric layer. Recesses are formed in the surface of the dielectric layer, such recesses terminating in a portion of the plurality of via holes passing through the dielectric layer. A metalization layer is deposited over the surface of the dielectric layer, portions of the metalization layer passing through the via holes, portions of the metalization layer being disposed in the recesses and portions of the metalization layer being disposed on the surface of the dielectric layer. The metalization layer is patterned into a plurality of conductors, one portion of the conductors being disposed on one level of the dielectric layer and another portion of the conductors disposed in the recesses.

With such method, electrical conductors are formed on different level using one only masking-etching step to form the via holes through the dielectric layer and only one metalization deposition step to deposit the metalization layer which provides both levels of conductors.

In accordance with another feature of the invention, a metalization system for an integrated circuit is provided. The system includes a substrate having a dielectric layer disposed over such substrate. A plurality of electrical conductors is provided, one portion of the conductors being disposed on one level of the dielectric layer and another portion of the conductors being recessed in a surface portion of the dielectric layer.

In accordance with another feature of the invention, one of the conductors on the first-mentioned level is adjacent to one of the conductors recessed into a portion of the surface of the dielectric layer.

In accordance with another feature of the invention, each one of the plurality of conductors has a portion thereof passing through the dielectric layer.

In accordance with still another feature of the invention, the plurality of conductors are parallel to one another.

In accordance with still another feature of the invention, the first-mentioned portion of the plurality of conductors have lower surface portions thereof disposed on an upper surface of the dielectric layer and wherein the conductors recessed into a portion of the surface of the dielectric layer have upper surface portions thereof disposed along the upper surface of the dielectric layer.

BRIEF DESCRIPTION OF THE DRAWING

Other features of the invention, as well as the invention itself, will become more readily apparent from the following detailed description when read together with the accompanying drawings, in which:

FIGS. 1A–1F are diagrammatical cross-sectional sketches of a semiconductor metalization system according to the PRIOR ART;

DETAILED DESCRIPTION

Figure 2A:
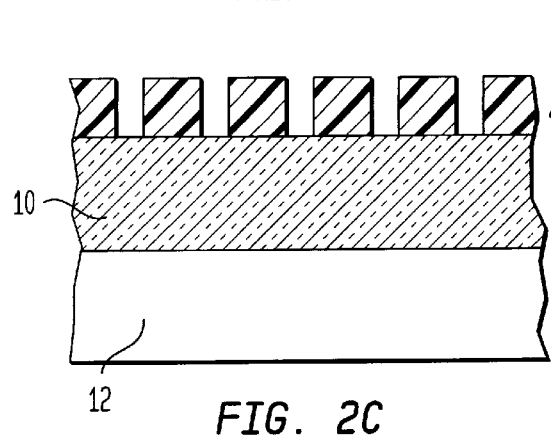
FIGS. 2A–2G are diagrammatical cross-sectional sketches of a semiconductor metalization system according to the PRIOR ART.
Figure 2B:
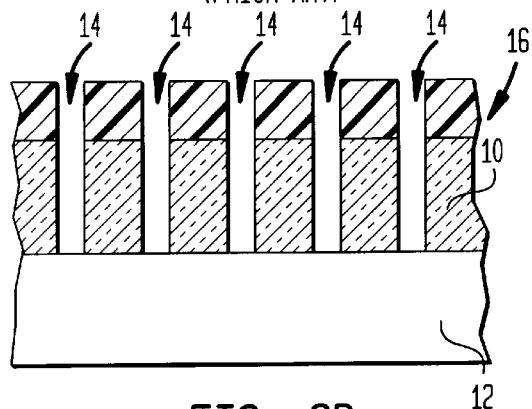
Figure 2C:
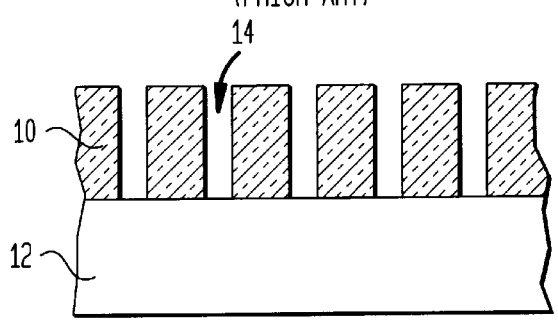
Figure 2D:
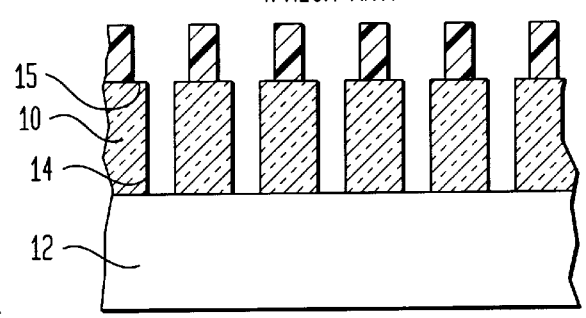
Figure 2E:
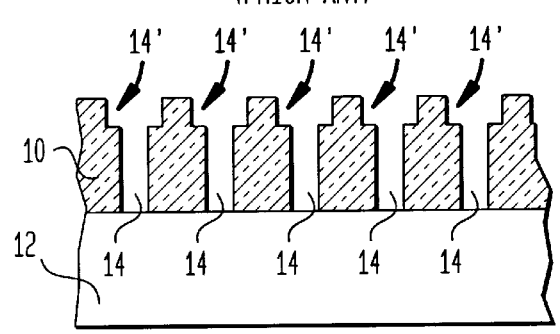
Figure 2F:
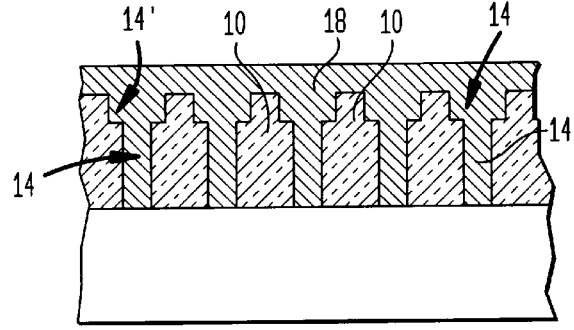
Figure 3A:
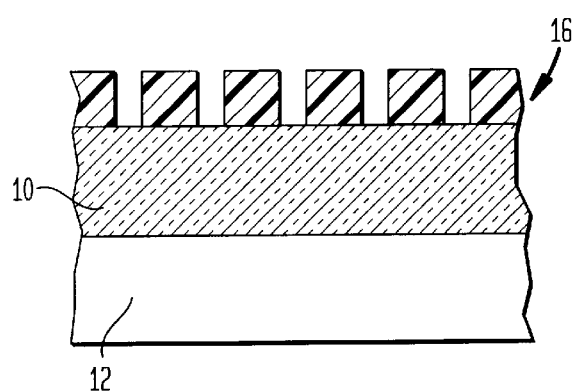
FIGS. 3A–3H are diagrammatical cross-sectional sketches of a semiconductor metalization system according to the invention.
Figure 3B:
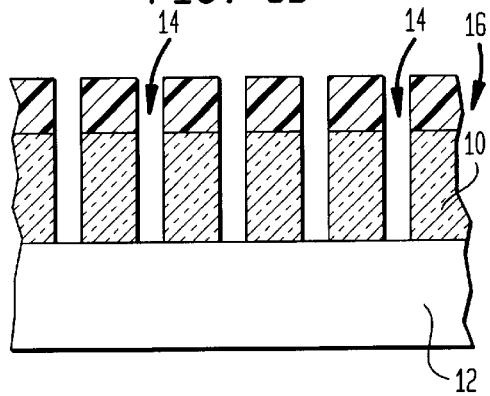
Figure 3C:
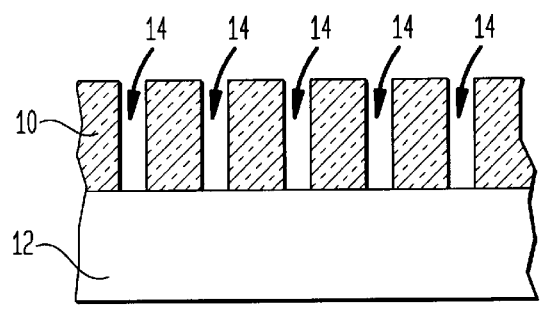
Figure 3D:
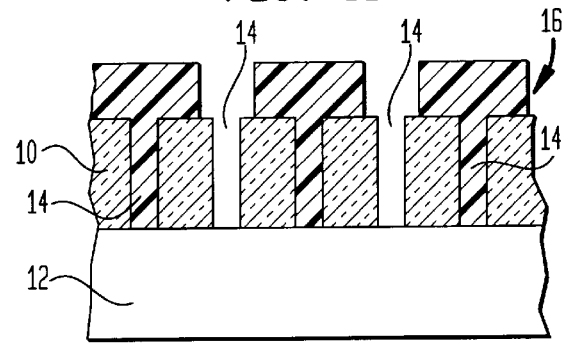
Figure 3E:
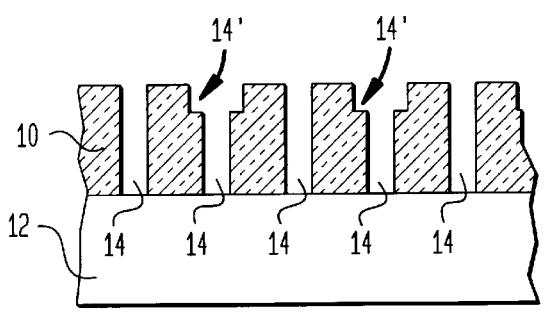
Figure 3F:
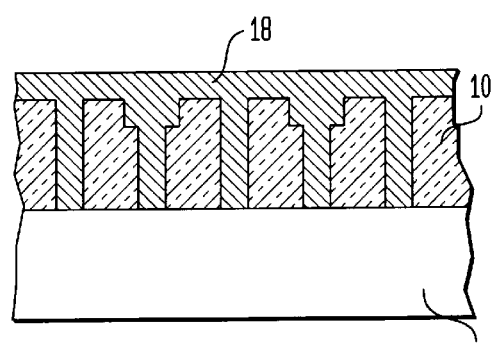
Figure 3G:
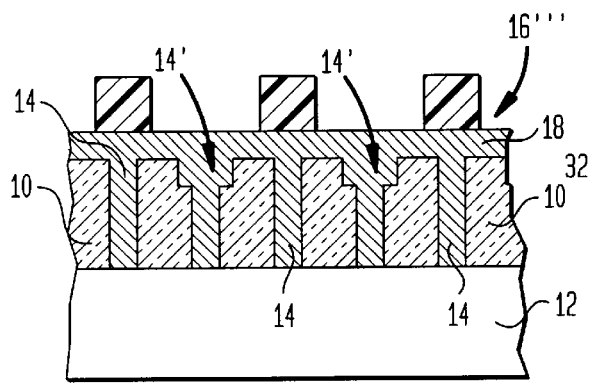

Referring now to FIG. 3A, a substrate 12, here for example a semiconductor substrate, is provided having formed therein a plurality of active devices, not shown. A dielectric layer 10 is formed over a surface of the substrate 12. A plurality of via holes 14 is formed through the dielectric layer 10, as shown in FIG. 3C, using etching mask 16 as shown in FIG. 3B and any conventional photolithographic-etching technique. The holes 14 are etched through the dielectric layer 10 to the substrate 10. A second mask 16" is formed over the structure, as shown in FIG. 3D. It is noted that the mask 16" is similar to the mask 16' in FIG. 2D. Here, however, the opening in the mask 16" covers and adjacent hole 14. Recesses 14' are formed in the upper portions of the upper surface of the dielectric layer 10 exposed by the openings in the mask 16", as shown in FIG. 3E. The recesses 14' terminate in an upper portion of the plurality of via holes 14' passing through the dielectric layer 10. A metalization layer 18 is deposited over the upper surface of the dielectric layer 10, as shown in FIG. 3F. Portions of the metalization layer 18 pass through the via holes 14, other portions of the metalization layer 18 are disposed in the recesses 14, and still other portions of the metalization layer 18 are disposed on the upper surface of the dielectric layer 18, as shown in FIG. 3F. The metalization layer 18 is masked with a mask 16''', as shown in FIG. 3G. The metalization layer 18 is patterned into a plurality of conductors 22, 22' with a mask 16''' using a RIE process to produce the structure shown in FIG. 3H. One portion of the conductors 22 are disposed on one level of the dielectric layer 10 and another portion of the conductors 22' are disposed in the recesses 14, as shown in FIG. 3H.

More particularly, referring to FIG. 3A, the dielectric layer 10 formed over a semiconductor substrate 12 is silicon dioxide, it being understood that other dielectric materials may also be used. The via holes 16 are etched through the dielectric layer 10 using a patterned photoresist mask, as shown in FIG. 3B. The holes are etched with a pitch desired for separation between electrical conductors being formed. The second photoresist layer 16" is formed over the dielectric layer 10 and patterned to expose surface portions of the dielectric layer 10 disposed around the periphery of the via holes 14, as shown in FIG. 3D. It is noted that apertures are formed in the mask 16" over alternating one of the via holes 14. The exposed surface portions of the dielectric layer 10 are etched to form recesses 14' in the dielectric layer 10 around the via holes, as shown in FIG. 3D. It is noted that the recesses 141 are formed in the upper portions of only alternating ones of the via holes 14.

The metalization layer 18 (FIG. 3F) is deposited over the surface of the etched dielectric layer 10, portions of the metalization layer 18 passing through the via holes 14, other portions of the metalization layer 18 being disposed in the recesses 14' and still other portions of the metalization layer 18 being disposed on the surface of the dielectric layer 10, as shown in FIG. 3G. A second photoresist layer 16''' is disposed over the metalization layer 18, as shown in FIG. 3G. It is noted that apertures in the mask 16''' are disposed over only the recesses 14' with such mask 16''' being disposed over the via holes 14 which do not have the recesses 14'. The mask 16''' is used to an etching mask to pattern of the metalization layer 18 as shown in FIG. 3H. Thus, the metalization layer 18 (FIG. 3G) is patterned into electrical conductors 22, 22'. More particularly, a RIE process is used to remove the exposed portions of the metalization layer 18 to thereby form the dielectrically isolated conductors, 22, 22' as shown in FIG. 3F.

Figure 2G:
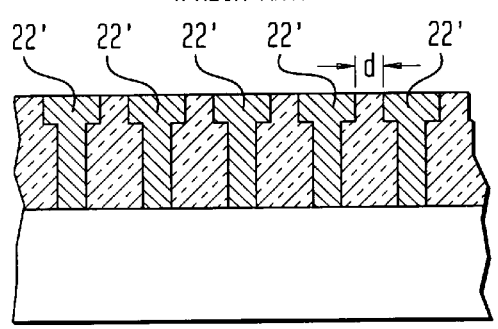
Figure 3H:
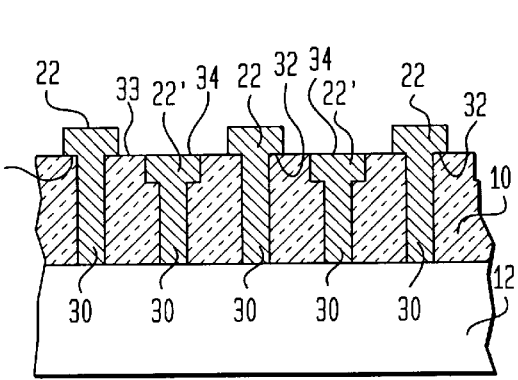
Figure 4:
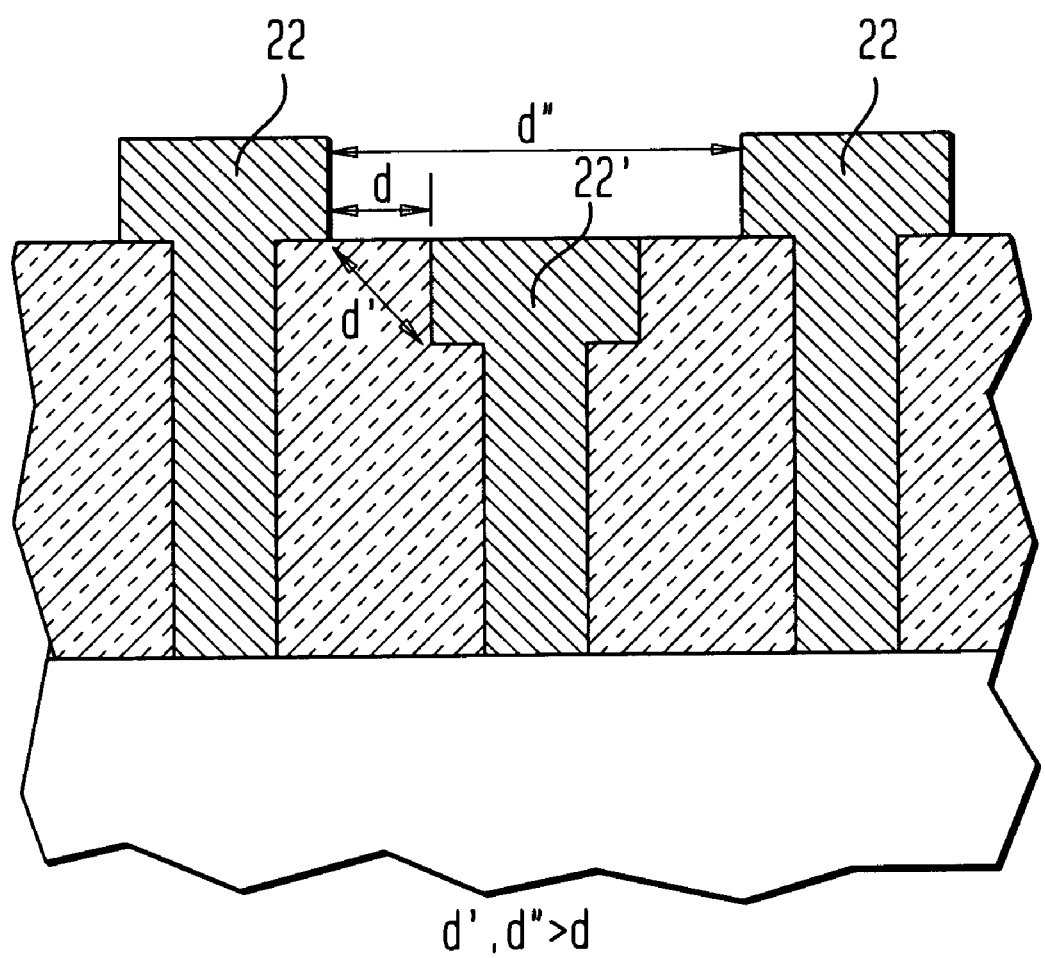
FIG. 4 is a diagrammatical sketch of a portion of the sketch of FIG. 3H.

Thus, as shown in FIG. 3H, a metalization system is provided for an integrated circuit wherein the semiconductor substrate 12 has the dielectric layer 10 disposed over such substrate. The plurality of electrical conductors 22, 22' is provided, one portion of the conductors, i.e., portion 22, being disposed on one level of the dielectric layer, here the upper surface of the dielectric layer 10, and another portion of the conductors 22' being recessed in a surface portion of the dielectric layer 10. The conductors 22 are adjacent to the conductors 22' recessed into a portion of the surface of the dielectric layer 10. Each one of the plurality of conductors 22, 22' has a portion 30 thereof passes through the dielectric layer 10. The plurality of conductors 22, 22' run parallel to one another in a direction perpendicular to the plane of the paper. The plurality of conductors 22 have lower surface portions 32 thereof disposed on an upper surface 33 of the dielectric layer 10 and the conductors 22' recessed into a portion of the surface of the dielectric layer 10 have upper surface portions 34 thereof disposed along the upper surface 33 of the dielectric layer 10. Thus, the distance between adjacent conductors 22, 22' is increased from the distance d described above in connection with FIG. 2G along the sidewalls of adjacent conductors 22, 22'. For example, referring to FIG. 4, it is noted that the distance d is the pitch between adjacent conductors 20, 22; however, the actual distance d' separating the current carrying portions of the adjacent conductors 22, 22' is greater than the pitch d. Further, the distance d", d' between adjacent conductors on the same plane, e.g., conductors 22, conductors 22', respectively) is greater than the pitch d.

It should be understood that the process described above may be used with many different conductive materials, such a doped amorphous or polycrystalline silicon, or metals including one, or a combination of, the following: titanium, titanium nitride, tungsten nitride, aluminum, cobalt, tantalum, tantalum nitride, copper, silver, gold, platinum, rubidium, rubidium oxide, iridium or iridium oxide, for example. Further, the patterning of the metalization layer may be by etching such metalization layer using reactive ion etching, ion milling, anisotropic dry etching, or wet etching when the pitch is relatively large, for example. The conductors may be used for word lines, bit lines, address lines and control clock lines in DRAM cells, for example, and for data bus lines and input/output lines in most semiconductor devices, for example.

It is noted that the process described above in connection with FIGS. 3A–3H may be used to provide a second layer of conductors.

Other embodiments are within the spirit and scope of the appended claims. For example, while the substrate 12 above is a semiconductor substrate, the substrate may be a metalization layer.

What is claimed is:

1. A metalization system for an integrated circuit, comprising:
   a substrate;
   a dielectric layer disposed over the substrate, the dielectric layer having a top surface defining a first plane;
   a plurality of electrical conductors disposed parallel to the first plane, some of the conductors being disposed on the top surface of the dielectric layer and some of the conductors being recessed below the top surface of the dielectric layer, each conductor including a portion extending through via holes formed in the dielectric layer.

2. The system as recited in claim 1, wherein the conductors alternate between conductors on the surface of the dielectric layer and conductors recessed into the dielectric layer.

3. The system as recited in claim 1, wherein each conductor on the surface of the dielectric layer is adjacent to two conductors recessed into the dielectric layer.

4. The system as recited in claim 1, wherein each conductor recessed into the dielectric layer is adjacent to two conductor on the surface of the dielectric layer.

5. The system as recited in claim 1, wherein each conductor has an effective distance between adjacent conductors which is larger than adjacent conductors placed on a same level.

6. The system as recited in claim 1, wherein the substrate is a semiconductor substrate.

7. The system as recited in claim 1, wherein the substrate is a metalization layer.

8. A metalization system for an integrated circuit, comprising:

a substrate;

a dielectric layer disposed over the substrate, the dielectric layer having a top surface defining a first plane;

a plurality of dual damascene structures formed in the dielectric layer, the dual damascene structures including a metal line portion disposed parallel to the first plane and contact portions formed in via holes, the via holes in communication with metal line trenches formed to support the metal line portion;

the metal line portions including a first set of metal lines on the top surface of the dielectric layer and a second set of metal lines being recessed below the top surface of the dielectric layer.

9. The system as recited in claim 8, wherein the metal line portion alternate between metal lines of the first set and the metal lines of the second set.

10. The system as recited in claim 8, wherein each metal line of the first set is adjacent to two metal lines of the second set.

11. The system as recited in claim 8, wherein each metal line of the second set is adjacent to two metal lines of the first set.

12. The system as recited in claim 8, wherein each metal line has an effective distance between adjacent metal lines which is larger than adjacent metal lines placed on a same level.

13. The system as recited in claim 8, wherein the substrate is a semiconductor substrate.

14. The system as recited in claim 8, wherein the substrate is a metalization layer.

* * * * *